(12) United States Patent
Dorairaj et al.

(10) Patent No.: US 7,640,527 B1
(45) Date of Patent: Dec. 29, 2009

(54) METHOD AND APPARATUS FOR PARTIAL RECONFIGURATION CIRCUIT DESIGN FOR A PROGRAMMABLE DEVICE

(75) Inventors: Nij Dorairaj, Campbell, CA (US); Eric M. Shiflet, Boulder, CO (US)

(73) Assignee: XILINX, Inc., San Jose, CA (US)

( * ) Notice: Subject to any disclaimer, the term of this patent is extended or adjusted under 35 U.S.C. 154(b) by 124 days.

(21) Appl. No.: 11/478,208

(22) Filed: Jun. 29, 2006

(51) Int. Cl.
G06F 17/50 (2006.01)
H03K 17/693 (2006.01)

(52) U.S. Cl. .......................................... 716/16; 716/4

(58) Field of Classification Search ............... 716/8–11, 716/16–17, 4, 5, 6; 703/14
See application file for complete search history.

(56) References Cited

U.S. PATENT DOCUMENTS

| | | | | |
|---|---|---|---|---|
| 5,946,219 | A * | 8/1999 | Mason et al. | 716/16 |
| 6,678,646 | B1 * | 1/2004 | McConnell et al. | 703/22 |
| 6,836,842 | B1 * | 12/2004 | Guccione et al. | 713/100 |
| 7,073,149 | B2 | 7/2006 | Knol et al. | |
| 7,100,134 | B2 * | 8/2006 | Wu et al. | 716/5 |
| 7,143,199 | B1 * | 11/2006 | Ambrose | 710/8 |
| 7,257,803 | B1 * | 8/2007 | Wilton et al. | 716/18 |
| 2002/0010903 | A1 * | 1/2002 | Osann et al. | 716/18 |
| 2004/0049759 | A1 * | 3/2004 | Osann et al. | 716/16 |
| 2005/0155008 | A1 * | 7/2005 | Archambeault et al. | 716/11 |
| 2005/0268269 | A1 * | 12/2005 | Coiley | 716/11 |

OTHER PUBLICATIONS

Dorairaj, Nij et al., "PlanAhead Software As A Platform For Partial Reconfiguration", Xcell Journal, 2005, pp. 68-71, available from Xilinx, Inc., 2100 Logic Drive, San Jose, CA 95124.
Goosman, Mark, et al., entitled "How to Take Advantage of Partial Reconfiguration in FPGA Designs", Programmable Logic Design Line, Feb. 6, 2006, 6 pages.

* cited by examiner

*Primary Examiner*—Paul Dinh
*Assistant Examiner*—Nha T Nguyen
(74) *Attorney, Agent, or Firm*—Robert M. Brush; Thomas George

(57) ABSTRACT

Method, apparatus, and computer readable medium for circuit design for a programmable device is described. In one example, a logical description of a circuit design having static logic and reconfigurable logic is imported into a graphical environment. The circuit design is processed in the graphical environment. In particular, the logical description is floorplanned to locate the static logic and the reconfigurable logic in a floorplan of the programmable device. At least one design rule check (DRC) is performed. A partial reconfiguration implementation of the circuit design is then managed for the programmable device.

17 Claims, 9 Drawing Sheets

(12) United States Patent
US 7,640,527 B1

METHOD AND APPARATUS FOR PARTIAL RECONFIGURATION CIRCUIT DESIGN FOR A PROGRAMMABLE DEVICE

FIELD OF THE INVENTION

One or more aspects of the present invention relate generally to electronic design and modeling systems for electronic circuits and, more particularly, to a method and apparatus for partial reconfiguration circuit design for a programmable logic device.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

Presently, a final logic design (referenced herein as the top-level design) for a PLD may include many logic pieces (referenced herein as modules). All of the logic pieces may be implemented at one time to form a full implementation for the target PLD. Alternatively, each module may be designed and implemented separately. Implemented modules are then combined to form a full implementation for the target PLD. Some PLDs are configured to support dynamic reconfiguration while active. That is, some PLDs have the ability to reprogram a portion of the PLD while the rest of the PLD continues to operate normally. Since a portion of the device may be reconfigured while the device is active, some type of predefined macros or other entity must be used as interfaces to the reconfigurable modules. One such instantiation of this implementation uses three-state buffer (tbuf) macros (also referred to as bus macros) as the interfaces of the reconfigurable modules. During reconfiguration, the tbuf macros allow a given module to be isolated from the portion of the design that is not being reconfigured.

To implement a partial reconfiguration design successfully, a designer must follow a strict design methodology using disparate tools. Accordingly, there exists a need in the art for a single environment for implementing a partial reconfiguration circuit design for a PLD.

SUMMARY OF THE INVENTION

Method, apparatus, and computer readable medium for circuit design for a PLD is described. In one embodiment, a logical description of a circuit design having static logic and reconfigurable logic is imported into a graphical environment. The circuit design is processed in the graphical environment. In particular, the logical description is floorplanned to locate the static logic and the reconfigurable logic in a floorplan of the PLD. At least one design rule check (DRC) is performed. A partial reconfiguration implementation of the circuit design is then managed for the PLD.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
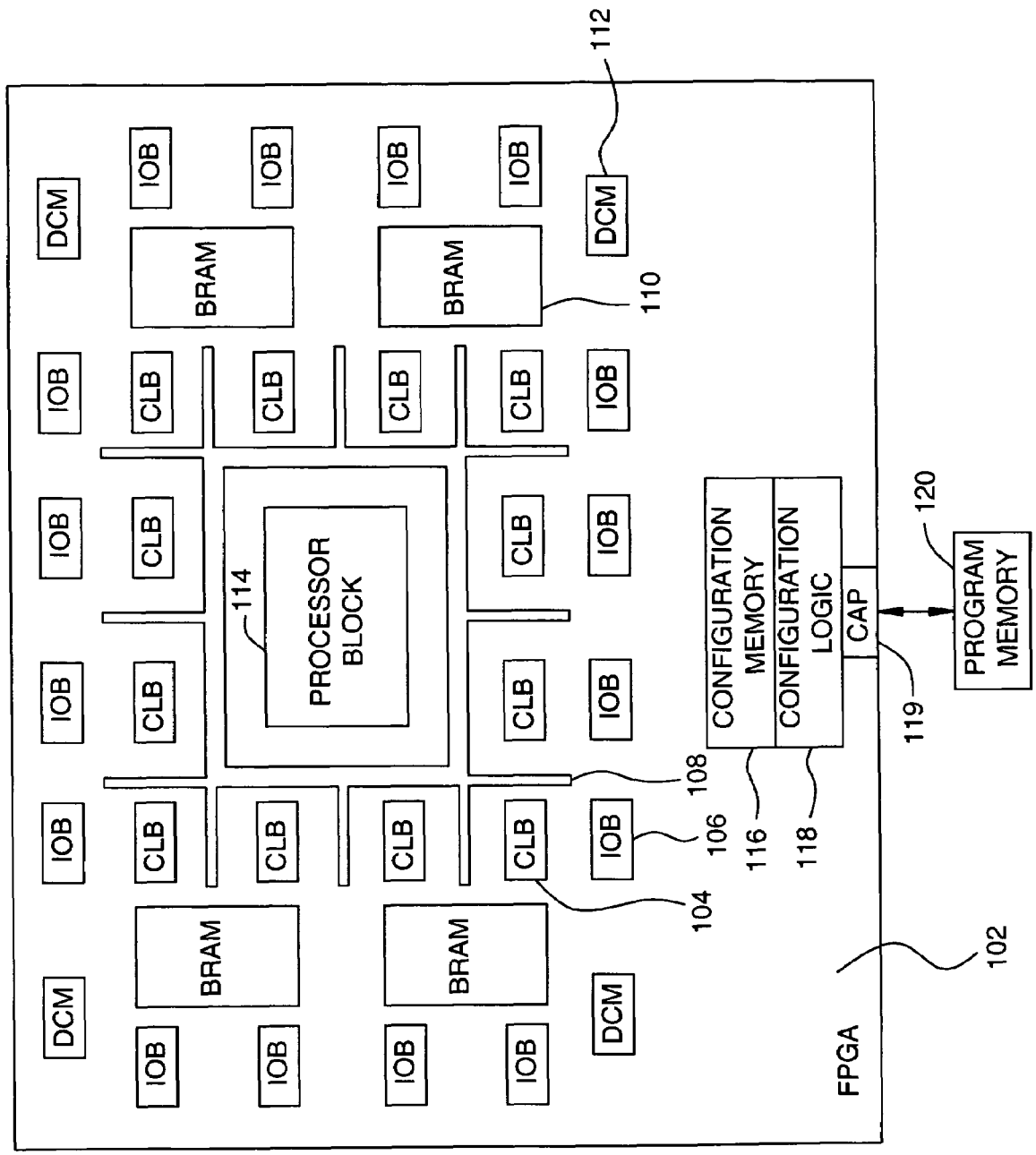
FIG. 1 is a block diagram depicting an exemplary embodiment of an FPGA coupled to a program memory.

FIG. 1 is a block diagram depicting an exemplary embodiment of an FPGA 102 coupled to a program memory 120. The FPGA 102 illustratively comprises programmable logic circuits or "blocks", illustratively shown as CLBs 104, IOBs 106, and programmable interconnect 108 (also collectively referred to as "programmable logic"), as well as configuration memory 116 for determining the functionality of the FPGA 102. The FPGA 102 may also include an embedded processor block 114, as well as various dedicated internal logic circuits, illustratively shown as blocks of random access memory ("BRAM 110"), configuration logic 118, digital clock management (DCM) blocks 112, global clock manager (GCM) blocks 111, and input/output (I/O) transceiver circuitry 122. Those skilled in the art will appreciate that the FPGA 102 may include other types of logic blocks and circuits in addition to those described herein.

As is well known in the art, the IOBs 106, the CLBs 104, and the programmable interconnect 108 may be configured to perform a variety of functions. Notably, the CLBs 104 are programmably connectable to each other, and to the IOBs 106, via the programmable interconnect 108. Each of the CLBs 104 may include one or more "slices" and programmable interconnect circuitry (not shown). Each CLB slice in turn includes various circuits, such as flip-flops, function generators (e.g., a look-up tables (LUTs)), logic gates, memory, and like type well-known circuits. The IOBs 106 are configured to provide input to, and receive output from, the CLBs 104.

Configuration information for the CLBs 104, the IOBs 106, and the programmable interconnect 108 is stored in the configuration memory 116. The configuration memory 116 may include static random access memory (SRAM) cells. The configuration logic 118 provides an interface to, and loads configuration data to, the configuration memory 116. A stream of configuration data ("configuration bitstream") produced from the program memory 120 may be coupled to the configuration logic 118 through a configuration port 119. The configuration process of FPGA 102 is also well known in the art.

The GCM blocks 111 and the DCM blocks 112 provide well-known clock management circuits for managing clock signals within the FPGA 102, such as delay lock loop (DLL) circuits and multiply/divide/de-skew clock circuits. The processor block 114 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic of the FPGA 102 (e.g., CLBs 104, IOBs 106). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art.

The processor block 114 is coupled to the programmable logic of the FPGA 102 in a well known manner. For purposes of clarity by example, the FPGA 102 is illustrated with 12 CLBs, 16 IOBs, 4 BRAMs, 4 DCMs, and one processor block. Those skilled in the art will appreciate that actual FPGAs may include one or more of such components in any number of different ratios. For example, the FPGA 102 may be selected from the VIRTEX-II PRO family of products, commercially available from Xilinx, Inc. of San Jose, Calif. In another embodiment of the present invention a Virtex-4 FPGA from Xilinx may also be used.

Figure 2:
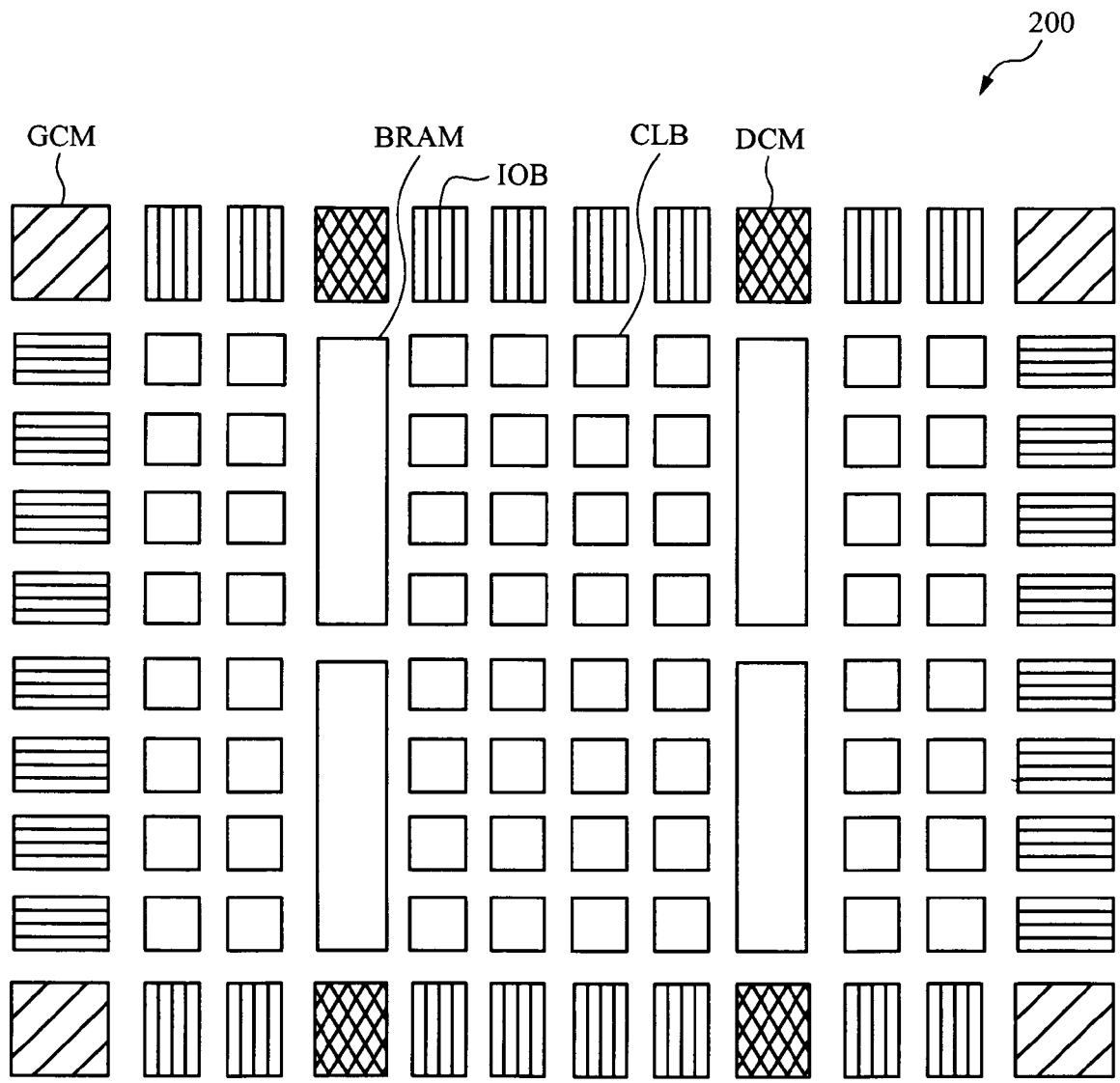
FIG. 2 is a block diagram depicting a portion of a floorplan of the FPGA of FIG. 1.

FIG. 2 is a block diagram depicting a portion 200 of a floorplan of the FPGA 102 of FIG. 1. In the portion 200, the CLBs 104, IOBs 106, and BRAMs 110 are arranged into columns to facilitate configuration. For convenience, interconnect resources are considered part of the CLB columns and are therefore not shown in FIG. 2. In the present example, each column of CLBs 104 includes one of the IOBs 106 at each of its upper and lower ends. Columns of the IOBs 106 are located at the left and right sides of the CLB array. Each column of IOBs 106 includes one of the GCMs 111 at each of its upper and lower ends. The portion 200 also illustratively includes columns of BRAMs 110, each of which includes one of the DCMs 112 at each of its upper and lower ends. Configuration memory cells of the configuration memory 116 are arranged in vertical frames that extend the length (top to bottom) of the CLB, IOB, and BRAM columns. The FPGA 102 is configured on a frame-by-frame basis. Those skilled in the art will appreciate that the floorplan of FIG. 2 is merely illustrative. The floorplan of a typical FPGA includes many more columns of CLBs and may include a processor block, as well as other types of dedicated circuitry discussed above.

Figure 3:
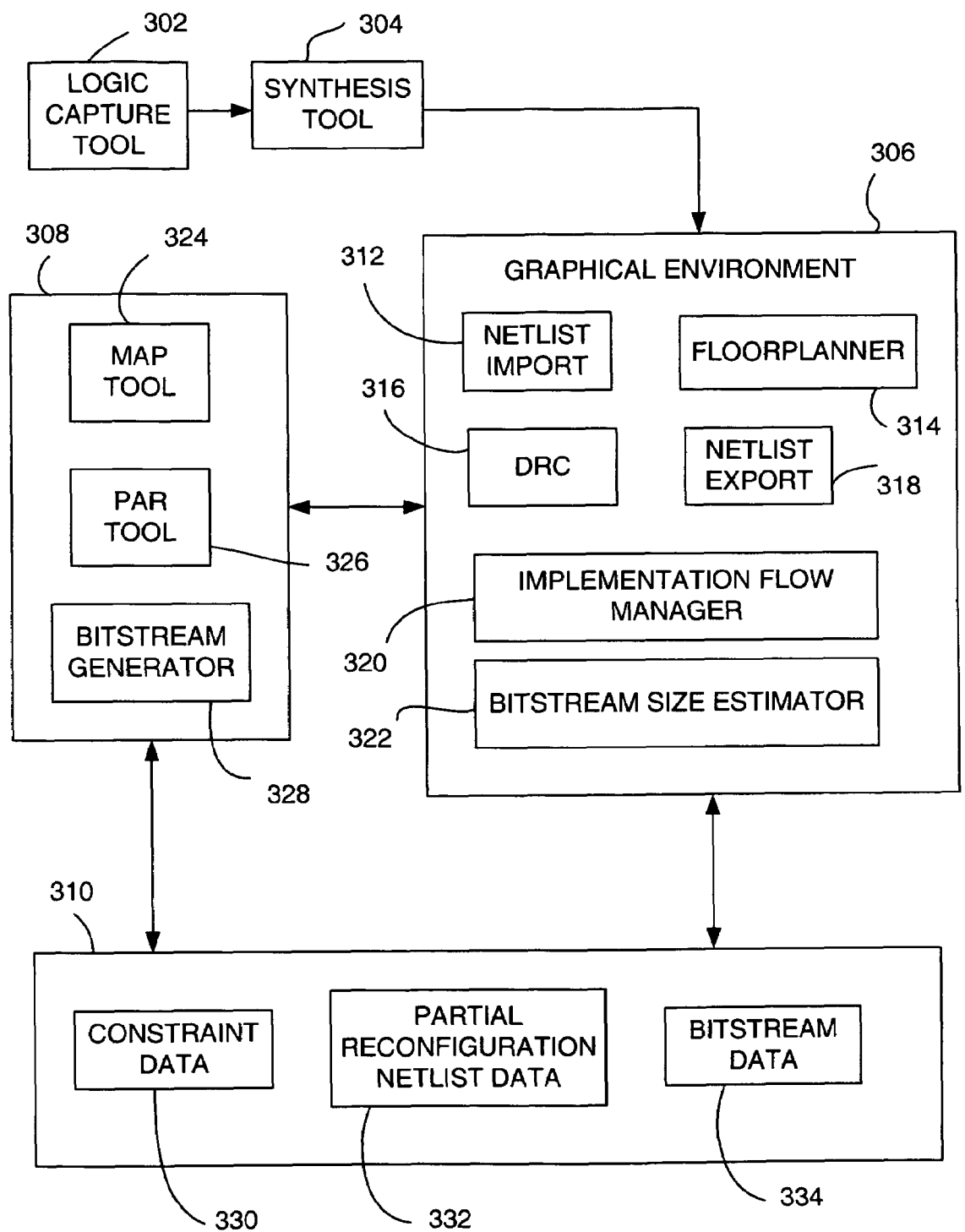
FIG. 3 is a block diagram depicting an exemplary embodiment of a logic design system for a programmable logic device (PLD) constructed in accordance with one or more aspects of the invention.

FIG. 3 is a block diagram depicting an exemplary embodiment of a logic design system 300 for a programmable logic device (PLD) constructed in accordance with one or more aspects of the invention. The system 300 includes a logic capture tool 302, a synthesis tool 304, a graphical environment 306, implementation tools 308, and a database 310. In the present embodiment, the system 300 is configured to implement a logic design using a target FPGA. Accordingly, the implementation tools 308 include a map tool 324, a place-and-route (PAR) tool 326, and a bitstream generator 328. The system 300 may be implemented using the computer 500 of FIG. 5 and described below. Notably, the elements of the system 300 may be part of one or more software programs stored in a memory and configured for execution by a central processing unit (CPU).

The logic capture tool 302 is configured to capture a circuit design from a user and generate a behavioral description of the circuit design. The behavioral description includes a plurality of circuit components, such as flip-flops, memories, LUTs, and the like, connected together via signal conductors (nets). The logic capture tool 302 may include a graphic interface through which a designer connects symbols and blocks representing various components to produce a schematic description of the circuit design. The logic capture tool 302 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

The synthesis tool 304 is configured to receive the behavioral description from the logic capture tool 302. The synthesis tool 304 processes the behavioral description to produce a logical description of the circuit design. The logical description includes a logical network list ("netlist") of lower-level circuit elements and logic gates, as well as connections (nets) between inputs and outputs thereof, in terms of the hierarchy specified in the behavioral description. For example, the logical description may be compliant with the Electronic Design Interchange Format (EDIF). The synthesis tool 304 may also generate constraint data associated with the logical description that includes various timing and layout constraints. Alternatively, the logical description may be annotated with constraint data. Such an annotated netlist is produced by XST synthesis tool, commercially available by Xilinx, Inc., of San Jose, Calif.

One or more aspects of the invention relate to creating dynamically reconfigurable modules for use in an FPGA. In particular, the logic design is divided into a top-level design having modules. Each of the modules is either a static module or a reconfigurable module. A reconfigurable module is capable of partial dynamic reconfiguration when the target FPGA is active via a partial reconfiguration process. Once the target FPGA is active, a static module is fixed and cannot be reconfigured. The graphical environment 306 provides a single platform to manage the partial reconfiguration design flow.

In particular, the graphical environment 306 includes a netlist import module 312, a floorplanner 314, a design rule check (DRC) module 316, a netlist export module 318, an implementation flow manager 320, and a bitstream size estimator 322. The netlist import module 312 imports the logical description (e.g., one or more netlists) produced by the synthesis tool 304 into the graphical environment 306 for processing.

The floorplanner 314 comprises a graphical tool that gives a designer control over location of circuit components of a logic design in the target FPGA. In one embodiment, the floorplanner 314 displays a hierarchical representation of the logic design in a window of a graphic interface using hierarchy structure lines and colors to distinguish the different hierarchical levels. The window displays the floorplan of the target FPGA and allows the designer to place logic in the hierarchy of the design into physical blocks (Pblocks). A Pblock has an area that constrains a particular portion of the design logic. In some instances, Pblocks define rectangular areas in the floorplan. In other instances, Pblocks may define arbitrarily shaped areas in the floorplan and the implementation tools 308 will attempt to group the logic during placement (discussed below). The floorplanner 314 generates various constraints, which are stored as part of constraint data 330 in the database 310. Pblocks are further described in U.S. patent application Ser. No. 10/792,164, entitled "System for Representing the Logical and Physical Information of an Integrated Circuit", by David A. Knol, filed Mar. 3, 2004, which is herein incorporated by reference.

In one embodiment, the floorplanner 314 is used to locate partial reconfiguration modules (PRMs), static logic, and bus macros within the target FPGA. For each PRM, a Pblock is created within the FPGA floorplan to establish an area for the PRM logic. Pblocks include attributes for position, range, and mode. Each PRM Pblock includes constraints for position and range of the Pblock. Position and range are defined with respect to columns in the floorplan of the FPGA. The mode of each PRM Pblock is set to indicate a reconfigurable module. For the static logic, each top-level module in the design hierarchy (other than the PRMs) is grouped together into a single Pblock. The static Pblock has a defined position attribute, but not a defined range attribute. Bus macros are placed on the boundaries between PRM(s) and the static logic. Bus macros may be instantiated as "black boxes" in the logical description (netlist) and are filled with a pre-defined routing macro during placement and routing by the implementation tools 308. In another embodiment, the floorplanner is used to place logic interface macros, instead of bus macros. A logic interface macro comprises a set of programmable logic in the target FPGA. For example, a logic interface macro may include a predefined set of CLB slices along with associated routing resources.

The DRC module 316 is configured to check for design violations. Given the complexity of the partial reconfiguration design flow, it is common for mistakes to be introduced in the original logical description (netlist) and during the floorplanning process. The DRC module 316 is configured to perform one or more design rule checks. In one embodiment, the DRC module 316 performs one or more of the following DRC checks: bus macro DRC, floorplanning DRC, glitching logic DRC, and timing advisor DRC. The bus macro DRC provides verification for all design rules related to bus macro connectivity and placement. One example of a bus macro DRC is the partial reconfiguration bus macro placement (PRBP) check. The PRBP DRC checks for all rules that should be followed for bus macro placement. Other examples of bus macro DRCs include bus macros for nets connecting partial reconfiguration modules to static logic (PRNM), bus macro direction (PRBD), bus macro orientation (PRBO), and bus macro net connectivity (PRBN).

The floorplanning DRC checks that clock objects (global clock buffers, DCM) and I/Os are correctly placed and that the static logic is correctly clustered. Exemplary floorplanning DRCs include glitching logic above and below a partial reconfiguration region (PRR), and any logic other that partial reconfiguration logic should be part of a static logic cluster (PRSG), excluding 10 and clock resources. The glitching logic DRC verifies that glitchable logic elements are not placed above or below PRM Pblocks. Certain types of logic, referred to as "glitchable logic," are not allowed to be placed within the same bit frame of any PRM. "Glitchable" means that the programming of the same value into a memory cell will not go unnoticed to the executing logic. In current FPGA devices, this is equivalent to not allowing glitchable logic to be placed above or below any PRM implementation area. Glitchable logic is target device specific and includes, for example, LUT-RAMs, BRAMs, shift-registers, and like type logic elements.

The timing advisor DRC provides a check for timing-related issues. One example of a timing DRC is the PRTP check. The static module is implemented before the PRM(s) during the implementation phase. Regular timing constraints do not cover the paths that cross between the static logic and a PRM. This does not present a problem provided that the bus macro between the static logic and the PRM is synchronous. However, if the bus macro is asynchronous, the static logic is not "aware" of the propagating of asynchronous paths. This may be important if these paths are timing critical. One way to pass this information to the static logic is to specify a TPSYNC constraint on the bus macro output net. The DRC module 316 will recommend a TPSYNC constraint that can be added to the constraint data 330. TPSYNC is a timing constraint that allows a designer to specify the duration in time that a signal will take to propagate from point A to point B, where A or B may be a bus macro.

The netlist export module 318 is configured to export the original logical description (hierarchical netlist) into a partial reconfiguration style netlist that has a specific format, for example, static and PRM netlists in separate directories. That is, a netlist is generated for the static logic and a netlist is generated for each of the PRMs. The output of the netlist export module 318 is stored in the database 310 as partial reconfiguration netlist data 332.

The implementation flow manager 320 controls the implementation tools 208 for implementing the design. In general, the map tool 324 processes the partial reconfiguration netlist data 332 and the constraint data 330. The map tool 324 maps the design onto physical resources within the target FPGA (i.e., the circuit components, logic gates, and signals are mapped onto LUTs, flip-flops, clock buffers, I/O pads, and the like of the target FPGA). The map tool 324 produces a mapped circuit description in accordance with any constraints in the constraint data 330. The mapped circuit description includes groupings of the physical resources of the target FPGA expressed in terms of CLBs and IOBs that include these resources.

The PAR tool 326 is configured to receive the mapped circuit description from the map tool 324 and the constraint data 330. The PAR tool 326 determines placement for the physical resource groupings of the mapped circuit description in the target FPGA and apportions the appropriate routing resources. The PAR tool 326 performs such placement and routing in accordance with any constraints in the constraint data 330. The PAR tool 326 produces physical design data. The bitstream generator 328 is configured to receive the physical design data from the PAR tool 326 and produce bitstream data 334 for the target FPGA, which is stored in the database 310.

In one embodiment, the implementation flow manager 220 manages four implementation steps: (1) initial budgeting; (2) static module implementation; (3) PRM implementation (one implementation for each version or "flavor" of every PRM); and (4) assembly and bitstream generation. During the initial budgeting phase, a determination is made whether the floorplan is valid by running DRCs. The floorplan information and timing constraints are merged into a design netlist to be used during implementation (e.g., mapping, placement, routing).

During the static module implementation phase, the static logic is mapped onto physical resources in the target FPGA using the map tool 324 in accordance with the constraint data 330. The static logic design is then placed and routed using the PAR tool 326 in accordance with the constraint data 330.

During the PRM implementation phase, each version or "flavor" of every PRM is mapped using the map tool 324 and placed and routed using the PAR tool 326 in accordance with the constraint data 330. During the assembly and bitstream generation phase, the physical implementations of the static logic and the PRM(s) are combined to produce a complete physical design. In particular, at least one full bitstream is generated by combining the static logic implementation with selected flavors of the PRM(s). A plurality of partial bitstreams is generated for the various flavors of the PRM(s). The resulting full and partial bitstreams are stored in the database 310 as bitstream data 334.

The bitstream size estimator 322 is configured to estimate the size of one or more bitstreams generated during implementation. For example, the bitstream size estimator 322 may be used to estimate the size of a partial bitstream. Such information can be used for estimating the size of configuration memory storage, such as external FLASH memory. This information can also be used to calculate how long it will take to partially reconfigure an active device based on the bitstream memory interface.

Figure 6:
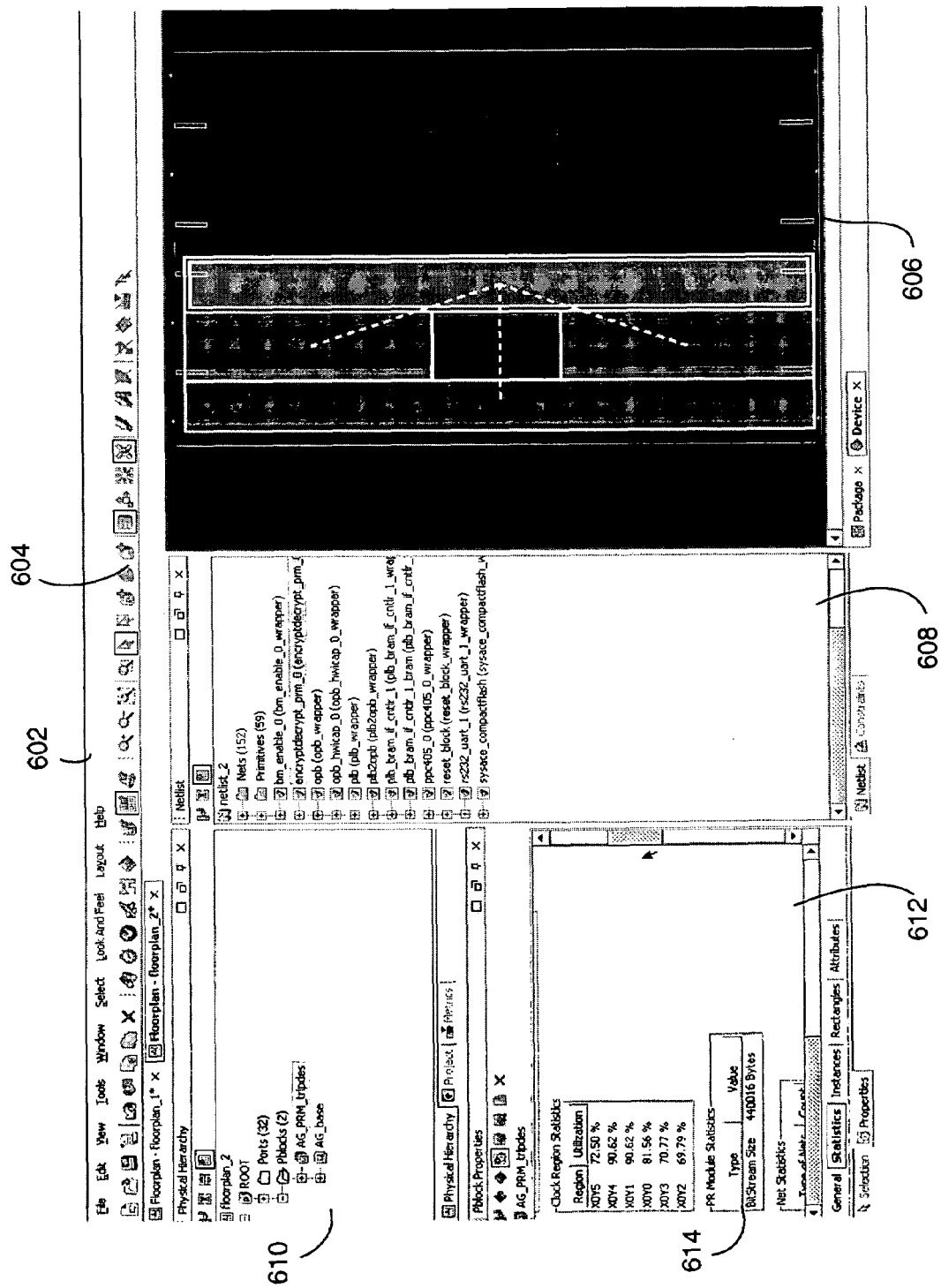
FIG. 6 illustrates an exemplary GUI that provides a front-end interface to the graphical environment in accordance with one or more aspects of the invention.

In one embodiment, the graphical environment 306 is implemented using a graphical user interface (GUI). FIG. 6 illustrates an exemplary GUI 600 that provides a front-end interface to the graphical environment 306 in accordance with one or more aspects of the invention. The GUI 600 illustratively includes a menu bar 602, a tool bar 604, a floorplan view 606, a netlist view 608, a physical hierarchy view 610, and a properties view 614. The floorplan view 606 includes a graphical representation of the floorplan of the target FPGA and the location of various Pblocks therein. The physical hierarchy view 610 includes a tree control showing the Pblocks in the design. In the present example, the Pblocks are designated as AG_base (static logic) and AG_PRM_tripdes (PRMs). The netlist view 608 includes a tree control showing the elements of the design as specified in the netlist. The properties view 614 shows various attributes and properties for a Pblock selected in the physical hierarchy view 610. In the present example, the properties view 614 is showing properties for the AG_PRM_tripdes Pblock. Notably, the properties view 614 includes a graphical indication 614 of the estimated bitstream size for the Pblock AG_PRM_tripdes, which is generated by the bitstream size estimator 322, as described above. As understood by those skilled in the art, the GUI 600 is one of a myriad of possible GUIs for implementing the graphical environment 306.

Figure 7:
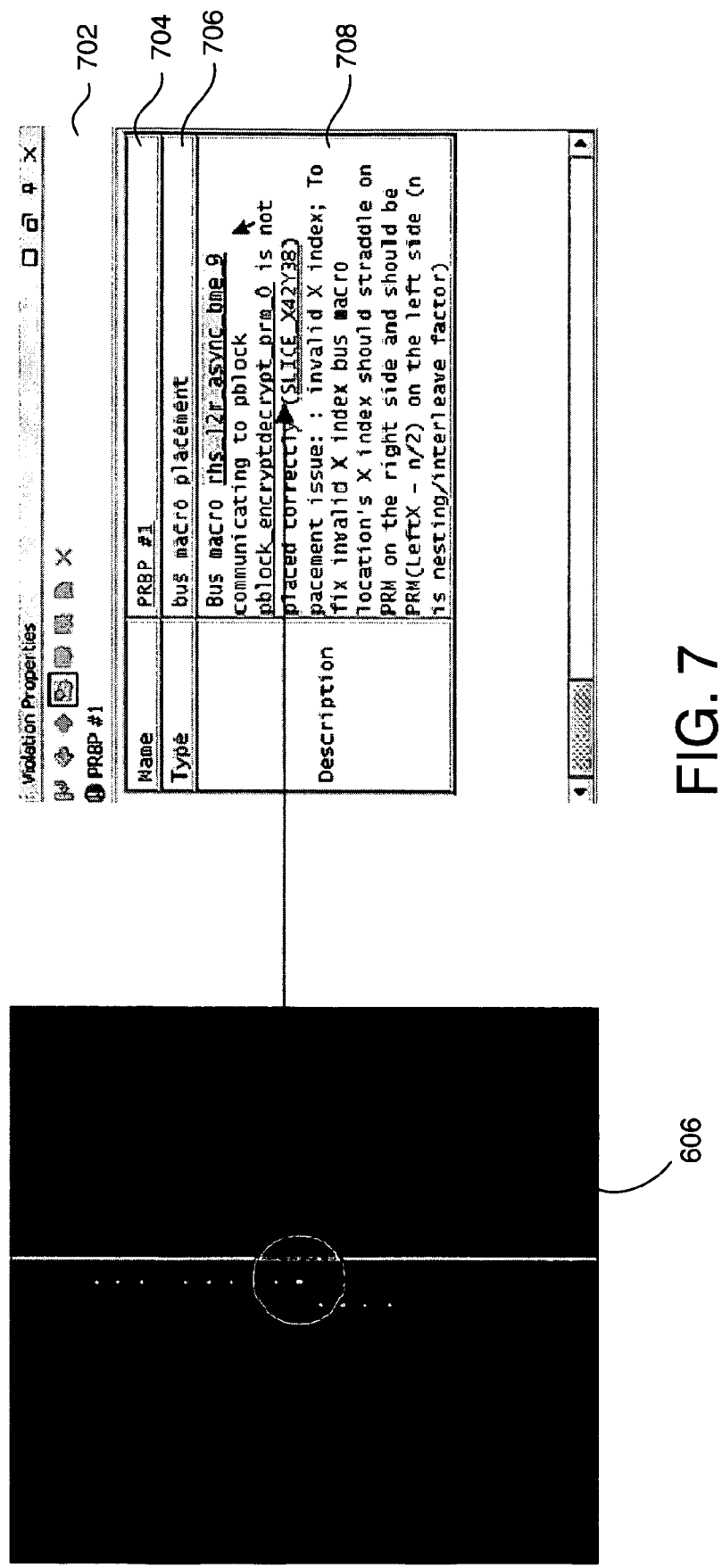
FIG. 7 illustrates an exemplary GUI triggered after execution of a DRC.

A circuit designer may interact with the GUI 600 (e.g., via the menu bar 602, the tool bar 604, and/or any of the views 606-614) to command execution of one or more DRCs. FIG. 7 illustrates an exemplary GUI 702 triggered after execution of a DRC. The GUI 702 includes an indication 704 of the particular DRC (e.g., PRBP in the present example), an indication 706 of the type of DRC (e.g., bus macro DRC in the present example), and a description field 708. The description field 708 includes information as to why the specified DRC failed. In the present example, the PRBP DRC failed because the bus macro designated as rhs_12r_async_bme_9 is not placed correctly in the floorplan view 606. The description field 708 also includes a recommendation for correcting the error. The GUI 702 may be a popup window with respect to the GUI 600. As understood by those skilled in the art, the GUI 700 is one of a myriad of possible GUIs for implementing a DRC information view.

Figure 8:
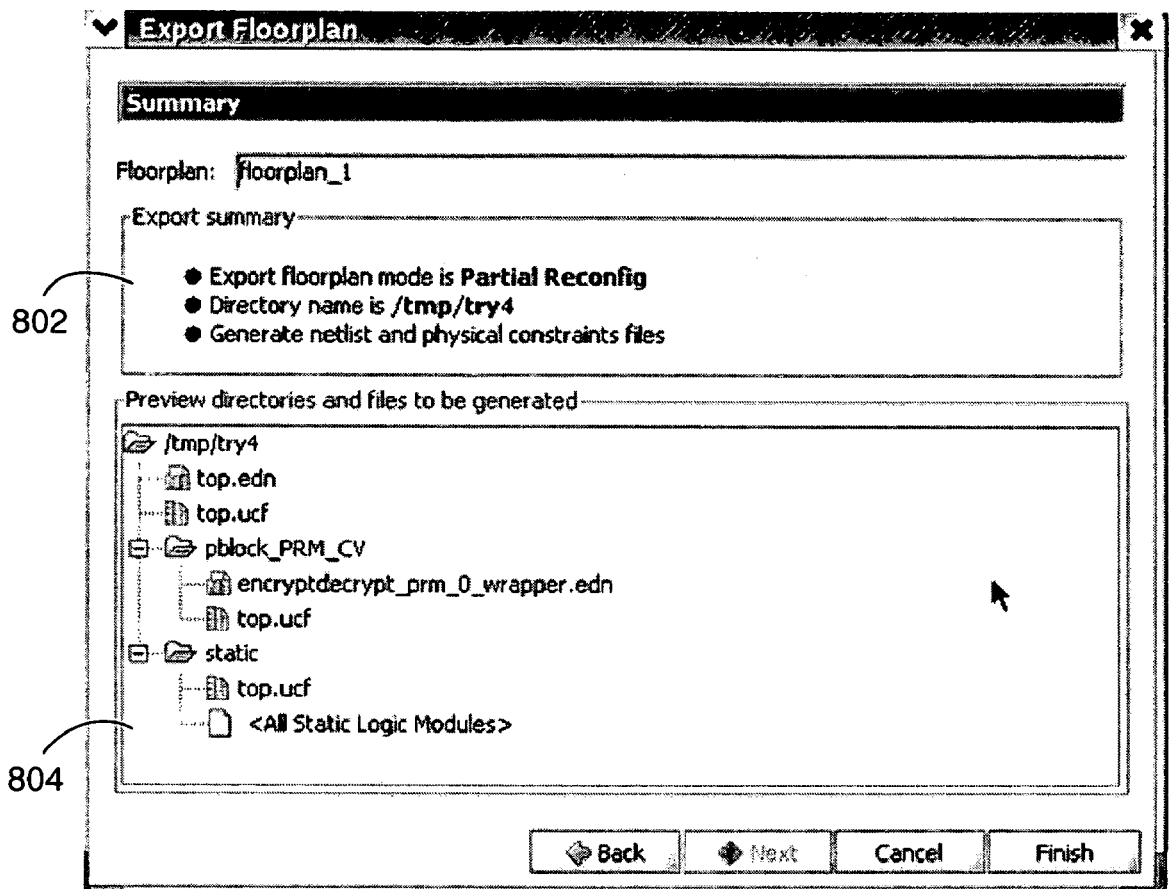
FIG. 8 illustrates a GUI triggered as part of an export netlist command.

FIG. 8 illustrates a GUI 800 triggered as part of an export netlist command. The GUI 800 includes an export summary field 802 and a directory field 804. In the present example, the export summary field 802 indicates the mode of export (e.g., partial reconfig), the name of the export directory (e.g., /tmp/try4), and an indication that the netlist and physical constraint files are to be generated. It is to be understood that the export summary field 802 may include other types of information. The directory field 804 includes a tree control illustrating the structure of the resulting exported netlists. In the present example, the PRM Pblock "encryptdecrypt_prm_0_wrapper" is located in a directory named pblock_PRM_CV and the static logic is located in a directory named static. As understood by those skilled in the art, the GUI 800 is one of a myriad of possible GUIs for implementing a netlist exportation.

Figure 9:
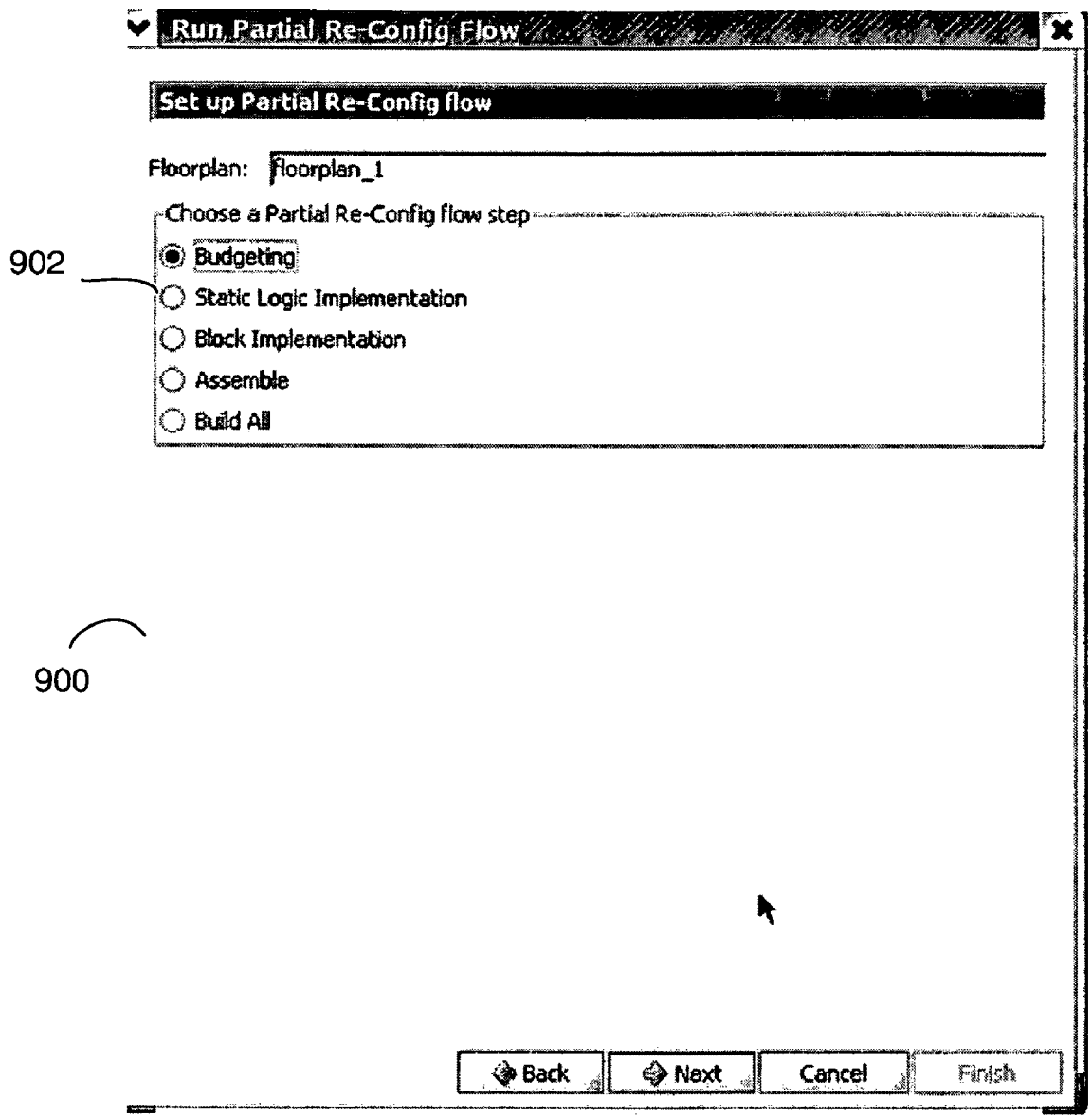
FIG. 9 illustrates a GUI for managing implementation of a circuit design.

FIG. 9 illustrates a GUI 900 for managing implementation of a circuit design. The GUI 900 includes a set of radio buttons 902 relating to the phases of implementation, namely, initial budgeting, static logic implementation, block implementation (i.e., PRMs), and assembly. The radio buttons 902 also include a "build all" button for executing all implementation phases. The implementation flow manager 320 may execute the GUI 900 as a "wizard" for managing the implementation phases.

Figure 4:
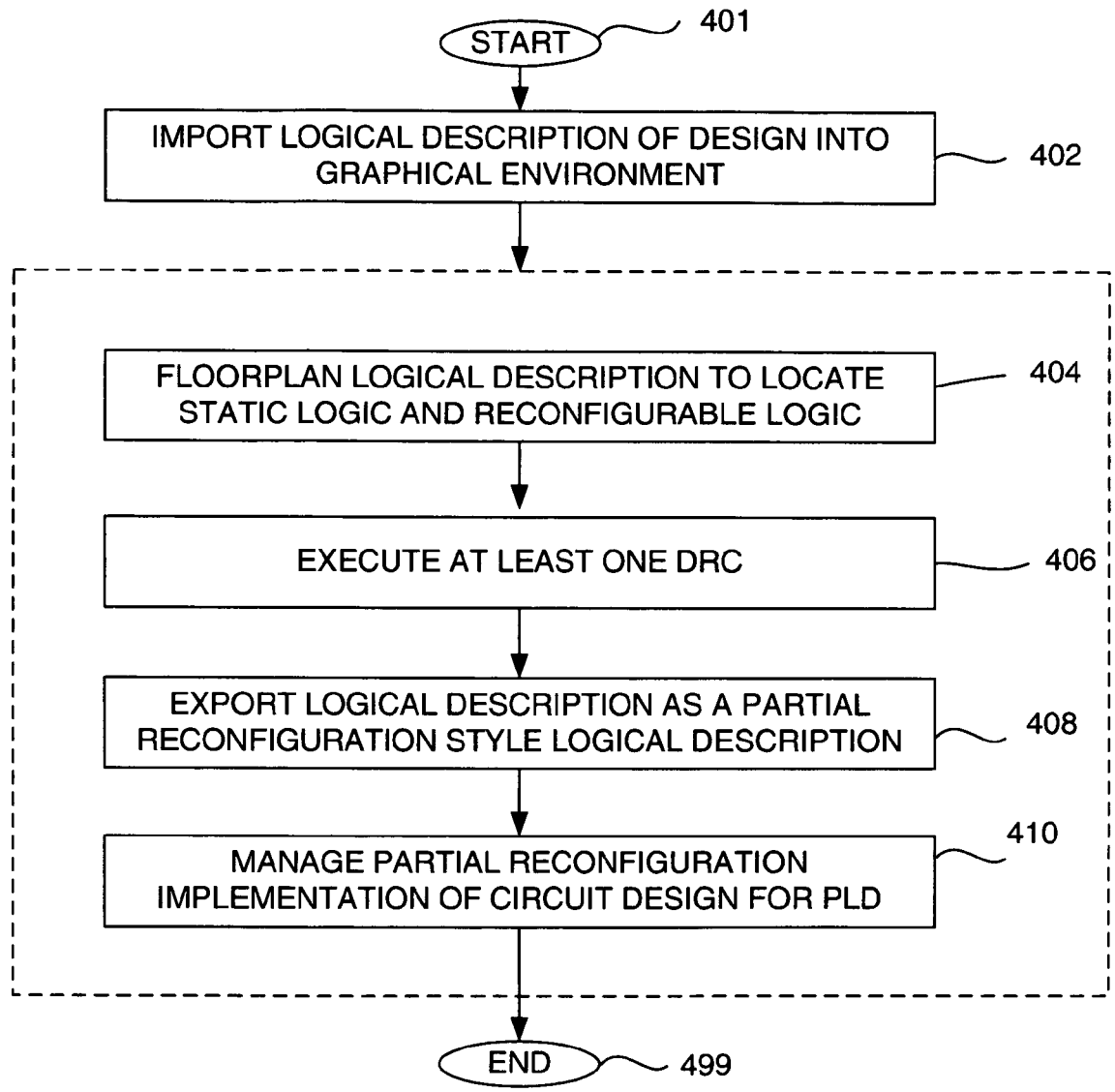
FIG. 4 is a flow diagram depicting an exemplary embodiment of a method of circuit design for a PLD in accordance with one or more aspects of the invention.

FIG. 4 is a flow diagram depicting an exemplary embodiment of a method 400 of circuit design for a programmable logic device (PLD) in accordance with one or more aspects of the invention. The method 400 begins at step 401. At step 402, a logical description of the circuit design is imported into a graphical environment. The logical description includes static logic and reconfigurable logic. The reconfigurable logic is designed for partial dynamic active reconfiguration when the target PLD is active via a partial reconfiguration process. In one embodiment, the logical description of the circuit design includes at least one synthesized netlist (also referred to as a gate-level netlist). The process 403 is then performed in the graphical environment.

The process 403 begins at step 404, where the logical description is floorplanned to locate the static logic and the reconfigurable logic in a floorplan of the PLD. In one embodiment, the reconfigurable logic includes at least one PRM. An area in the floorplan is assigned to each of the PRM(s). An area in the floorplan is also assigned to the static logic. Bus macros are placed at any interfaces between the static logic and the PRM(s). At step 406, at least one DRC is performed on the floorplanned design. In one embodiment, at least one of the following DRCs is/are performed: a bus macro DRC, a floorplanning DRC, a glitching logic DRC, and a timing advisor DRC. Such DRCs are described above.

At step 408, the logical description is exported into a partial reconfiguration style logical description. In one embodiment, the partial reconfiguration style logical description includes a netlist for the static logic and one or more netlists for the reconfigurable logic. At step 410, a partial reconfiguration implementation of the circuit design is managed for the PLD. In one embodiment, a GUI wizard is executed to manage initial budgeting, static logic implementation, PRM implementation, and assembly/bitstream generation. The method 400 ends at step 499.

Figure 5:
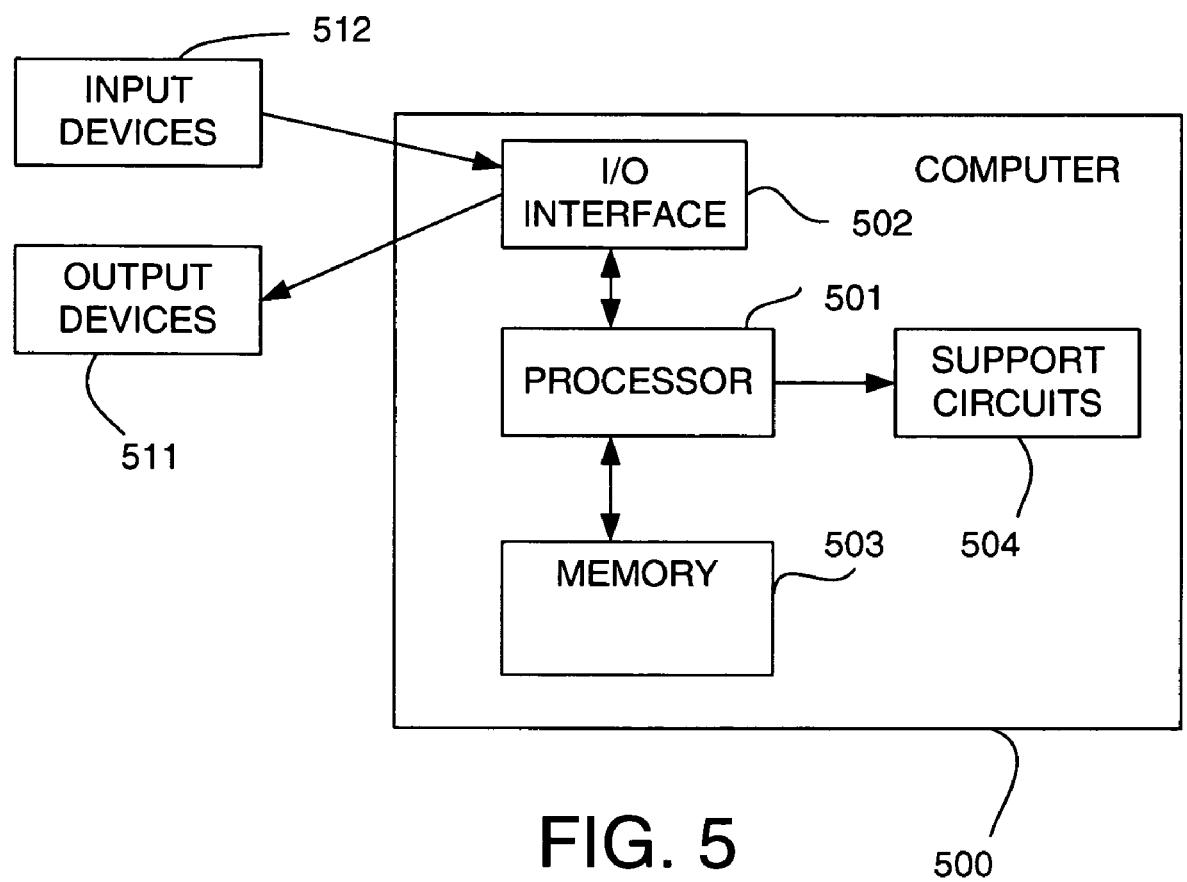
FIG. 5 is a block diagram depicting an exemplary embodiment of a computer suitable for implementing the processes and methods described herein.

FIG. 5 is a block diagram depicting an exemplary embodiment of a computer 500 suitable for implementing the processes and methods described herein. For example, the computer 500 may be used to implement the system 300 of FIG. 3, as well as the method 400 of FIG. 4. The computer 500 includes a processor 501, a memory 503, various support circuits 504, and an I/O interface 502. The processor 501 may be any type of microprocessor known in the art. The support circuits 504 for the processor 501 include conventional cache, power supplies, clock circuits, data registers, I/O interfaces, and the like. The I/O interface 502 may be directly coupled to the memory 503 or coupled through the processor 501. The I/O interface 502 may be coupled to various input devices 512 and output devices 511, such as a conventional keyboard, mouse, printer, display, and the like.

The memory 503 stores all or portions of one or more programs and/or data to implement the system 300 and the method 400 described herein. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 500 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 503. The memory 503 may include one or more of the following random access memory, read only memory, magneto-resistive read/write memory, optical read/write memory, cache memory, magnetic read/write memory, and the like, as well as computer readable media as described below.

An aspect of the invention is implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD). Such computer readable media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of circuit design for a programmable device, comprising:
    importing a logical description of a circuit design having static logic and reconfigurable logic into a graphical environment; and
    processing, by using a processor, the circuit design in a graphical user interface (GUI) of the graphical environment by:
        displaying a representation of the logical description in a netlist view of the GUI, a floorplan of the programmable device in a floorplan view of the GUI, and area constraints within the floorplan in a physical hierarchy view of the GUI;
        floorplanning the logical description to locate the static logic and the reconfigurable logic in the floorplan of the programmable device via interaction with at least one of the netlist view, the floorplan view, or the physical hierarchy view;
        performing at least one design rule check (DRC) via interaction with the netlist view, the floorplan view, and the physical hierarchy view; and
        managing a partial reconfiguration implementation of the circuit design for the programmable device by:
            implementing the static logic;
            implementing at least one partial reconfiguration module (PRM) of the reconfigurable logic; and
            assembling the static logic and the at least one PRM as implemented to generate a plurality of bitstreams including at least one full bitstream and at least one partial bitstream.

2. The method of claim 1, wherein the step of floorplanning comprises:
    assigning an area in the floorplan to each of at least one partial reconfiguration module (PRM) of the reconfigurable logic; and
    assigning an area in the floorplan to the static logic.

3. The method of claim 2, wherein the step of floorplanning further comprises:
    placing at least one bus macro in the floorplan.

4. The method of claim 1, wherein the at least one DRC includes at least one of a bus macro DRC, a floorplanning DRC, a glitching logic DRC, or a timing advisor DRC.

5. The method of claim 1, wherein the step of processing comprises:
    estimating a size of the at least one of the plurality of bitstreams.

6. The method of claim 1, wherein the step of managing further comprises:
    executing a wizard of the GUI to manage the steps of implementing the static logic, implementing the at least one PRM, and assembling.

7. Apparatus for circuit design for a programmable device, comprising:
    an import module for importing a logical description of a circuit design having static logic and reconfigurable logic into a graphical environment; and
    a graphical environment for processing the circuit design in a graphical user interface (GUI), the graphical environment having:
        a netlist view in the GUI configured to display a representation of the logical description;
        a floorplan view in the GUI configured to display a floorplan of the programmable device;
        a physical hierarchy view in the GUI configured to display area constraints within the floorplan;
        a floorplanner for floorplanning the logical description to locate the static logic and the reconfigurable logic in the floorplan of the programmable device via interaction with at least one of the netlist view, the floorplan view, or the physical hierarchy view;
        a design rule check (DRC) module for performing at least one DRC via interaction with the netlist view, the floorplan view, and the physical hierarchy view; and
        an implementation flow manager for managing a partial reconfiguration implementation of the circuit design for the programmable device by:
            implementing the static logic;
            implementing at least one partial reconfiguration module (PRM) of the reconfigurable logic; and
            assembling the static logic and the at least one PRM as implemented to generate a plurality of bitstreams including at least one full bitstream and at least one partial bitstream.

8. The apparatus of claim 7, wherein the floorplanner is configured to:

assign an area in the floorplan to each of at least one partial reconfiguration module (PRM) of the reconfigurable logic; and assign an area in the floorplan to the static logic.

9. The apparatus of claim 8, wherein the floorplanner is further configured to:

place at least one bus macro in the floorplan.

10. The apparatus of claim 7, wherein the at least one DRC includes at least one of a bus macro DRC, a floorplanning DRC, a glitching logic DRC, or a timing advisor DRC.

11. The apparatus of claim 7, wherein the graphical environment further comprises:

a bitstream size estimator for estimating a size of the at least one of the plurality of bitstreams.

12. The apparatus of claim 7, wherein the implementation flow manager is further configured to:

execute a wizard of the GUI to manage performance of implementation of the static logic and the at least one PRM and assembly.

13. A computer readable medium having stored thereon software that, when executed by a processor, causes the processor to perform a method of circuit design for a programmable device, comprising:

importing a logical description of a circuit design having static logic and reconfigurable logic into a graphical environment; and processing the circuit design in a graphical user interface (GUI) of the graphical environment by:

displaying a representation of the logical description in a netlist view of the GUI, a floorplan of the programmable device in a floorplan view of the GUI, and area constraints within the floorplan in a physical hierarchy view of the GUI;

floorplanning the logical description to locate the static logic and the reconfigurable logic in the floorplan of the programmable device via interaction with at least one of the netlist view, the floorplan view, or the physical hierarchy view;

performing at least one design rule check (DRC) via interaction with at least one of the netlist view, the floorplan view, and the physical hierarchy view; and managing a partial reconfiguration implementation of the circuit design for the programmable device by:

implementing the static logic;

implementing at least one partial reconfiguration module (PRM) of the reconfigurable logic; and assembling the static logic and the at least one PRM as implemented to generate a plurality of bitstreams including at least one full bitstream and at least one partial bitstream.

14. The computer readable medium of claim 13, wherein the step of floorplanning comprises:

assigning an area in the floorplan to each of at least one partial reconfiguration module (PRM) of the reconfigurable logic; and assigning an area in the floorplan to the static logic.

15. The computer readable medium of claim 14, wherein the step of floorplanning further comprises:

placing at least one bus macro in the floorplan.

16. The computer readable medium of claim 13, wherein the at least one DRC includes at least one of a bus macro DRC, a floorplanning DRC, a glitching logic DRC, or a timing advisor DRC.

17. The computer readable medium of claim 13, wherein for step of processing comprises:

estimating a size of the at least one of the plurality of bitstreams.

* * * * *